United States Patent
Ide (10) Patent No.: US 11,978,665 B2
(45) Date of Patent: May 7, 2024

(54) SEMICONDUCTOR MANUFACTURING METHOD AND SEMICONDUCTOR DEVICE

(71) Applicant: Kioxia Corporation, Tokyo (JP)

(72) Inventor: Kenichi Ide, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 387 days.

(21) Appl. No.: 17/469,291

(22) Filed: Sep. 8, 2021

(65) Prior Publication Data

US 2022/0293464 A1   Sep. 15, 2022

(30) Foreign Application Priority Data

Mar. 15, 2021   (JP) ................................ 2021-041724

(51) Int. Cl.
*H01L 21/768*   (2006.01)
*H01L 23/522*   (2006.01)

(52) U.S. Cl.
CPC .. *H01L 21/76843* (2013.01); *H01L 21/76802* (2013.01); *H01L 21/76876* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 5,227,191 A | 7/1993 | Nagashima | |
| 6,767,796 B2 | 7/2004 | Tanaka et al. | |
| 7,084,408 B1* | 8/2006 | Kimball | C23C 14/48 |
| | | | 250/424 |
| 2005/0263890 A1* | 12/2005 | Han | H01L 21/28556 |
| | | | 257/E21.585 |
| 2007/0077683 A1* | 4/2007 | Cerio, Jr. | C23C 14/046 |
| | | | 257/E21.586 |
| 2008/0206982 A1* | 8/2008 | Suzuki | C23C 16/45531 |
| | | | 438/627 |
| 2008/0272494 A1 | 11/2008 | Omoto et al. | |
| 2014/0299476 A1* | 10/2014 | Yasuda | C25D 5/18 |
| | | | 205/131 |

(Continued)

FOREIGN PATENT DOCUMENTS

| | | |
|---|---|---|
| JP | 2000-22107 A | 1/2000 |
| JP | 3175195 B2 | 6/2001 |

(Continued)

*Primary Examiner* — Alexander G Ghyka
(74) *Attorney, Agent, or Firm* — Finnegan, Henderson, Farabow, Garrett & Dunner, LLP (57) ABSTRACT

A semiconductor manufacturing method includes forming a concave portion in a layer provided above a substrate from a top surface of the layer downwards, the layer including an insulation layer at least partially. The method includes forming a silicon film on an inner surface of the concave portion. The method includes exposing the silicon film to a raw material gas of metal and an inhibitor gas that inhibits growth of the metal at a first temperature, to replace a first portion of the silicon film located in an upper-end side portion of the concave portion with a first conductive film containing the metal. The method includes exposing the silicon film to the raw material gas and the inhibitor gas at a second temperature lower than the first temperature, to replace a second portion of the silicon film with a second conductive film containing the metal.

3 Claims, 11 Drawing Sheets

(56) References Cited

U.S. PATENT DOCUMENTS

| 2017/0011960 | A1* | 1/2017 | Ko | H01L 21/76843 |
| 2017/0170062 | A1* | 6/2017 | Murray | H01L 21/76847 |
| 2017/0213762 | A1* | 7/2017 | Gouk | C23C 18/1653 |
| 2020/0144066 | A1 | 5/2020 | Jandl et al. | |

FOREIGN PATENT DOCUMENTS

| JP | 2002-118078 A | 4/2002 |
| JP | 2003-243537 A | 8/2003 |
| JP | 5745974 B2 | 7/2015 |

\* cited by examiner

FIG.11

SEMICONDUCTOR MANUFACTURING METHOD AND SEMICONDUCTOR DEVICE

CROSS REFERENCE TO RELATED APPLICATIONS

This application is based upon and claims the benefit of priority from the prior Japanese Patent Application No. 2021-41724, filed on Mar. 15, 2021, the entire contents of which are incorporated herein by reference.

FIELD

Embodiments of the present invention relate to a semiconductor manufacturing method and a semiconductor device.

BACKGROUND

In manufacturing of a semiconductor device, a wire may be formed by being embedded in a concave portion provided in an insulation layer. In this case, it is likely that a cavity is generated in the wire.

DETAILED DESCRIPTION

According to an embodiment, a semiconductor manufacturing method includes forming a concave portion in a layer provided above a substrate from a top surface of the layer downwards, the layer including an insulation layer at least partially. The method further includes forming a silicon film on an inner surface of the concave portion. The method further includes exposing the silicon film to a raw material gas of metal and an inhibitor gas that inhibits growth of the metal at a first temperature, to replace a first portion of the silicon film located in an upper-end side portion of the concave portion with a first conductive film containing the metal. The method further includes exposing the silicon film to the raw material gas and the inhibitor gas at a second temperature lower than the first temperature, to replace a second portion of the silicon film different from the first portion with a second conductive film containing the metal.

Figure 1:
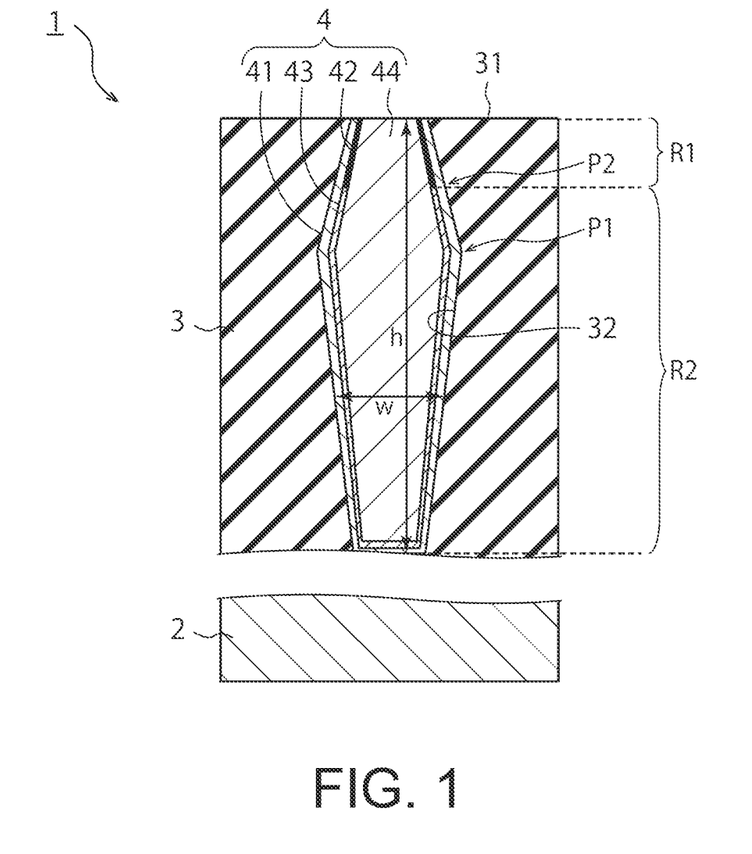
FIG. 1 is a diagram illustrating a semiconductor device according to an embodiment.

Embodiments of the present invention will be explained below with reference to the drawings. In FIGS. 1 to 7, same or identical constituent elements are denoted by like reference characters and redundant explanations thereof are omitted. FIG. 1 is a diagram illustrating a semiconductor device 1 according to an embodiment.

As illustrated in FIG. 1, the semiconductor device 1 according to the embodiment includes a semiconductor substrate 2, an interlayer dielectric film 3, and a wiring layer 4.

The interlayer dielectric film 3 is provided above the semiconductor substrate 2. A concave portion 32 is provided in the interlayer dielectric film 3 from a top surface 31 of the interlayer dielectric film 3 downwards. A width w in the lateral direction of the concave portion 32 is the maximum at a first position P1 between an upper end and a lower end of the concave portion 32. The width w of the concave portion 32 increases towards the first position P1 from the upper end of the concave portion 32. Further, the width w of the concave portion 32 decreases towards the lower end of the concave portion 32 from the first position P1. In other words, the cross-sectional shape of the concave portion 32 is substantially barrel-shaped, that is, substantially hexagonal. The shape of the concave portion 32 in which the width is the maximum at the first position P1 as described above is a shape obtained by process factors even if the width w of the concave portion 32 is designed to be uniform. For example, in a case where the concave portion 32 is formed by RIE (Reactive Ion Etching), the process factors include less adsorption of a by-product protecting a side wall from an etching gas in etching and ease of incidence of diagonal components of etching ions around the first position P1 of the concave portion 32. In addition, the cross-sectional shape of the concave portion 32 may be rounded. In the concave portion 32, its height h is larger than its width w. The concave portion 32 may be a hole. Alternatively, the concave portion 32 may be a groove or a slit that extends in the depth direction perpendicular to the width direction. The interlayer dielectric film 3 is a silicon oxide film, for example.

The wiring layer 4 is provided in the concave portion 32 so as to fill the concave portion 32. The wiring layer 4 incudes a barrier metal film 41, a first conductive film 42, a second conductive film 43, and a conductive layer 44.

The barrier metal film 41 is provided on the entire inner surface of the concave portion 32. The barrier metal film 41 is a titanium nitride film, for example.

The first conductive film 42 is provided on a first range R1 that is an upper-end side portion of the inner surface of the concave portion 32 via the barrier metal film 41. The first range R1 is a range in the inner surface of the concave portion 32 from the upper end to a second position P2 above the first position P1. The first conductive film 42 contains metal and an inhibitor that inhibits growth of the metal. The metal is tungsten, for example. The inhibitor is nitrogen, for example.

The second conductive film 43 is provided on a second range R2 of the inner surface of the concave portion 32 via the barrier metal film 41, the second range R2 being different from the first range R1. In the example illustrated in FIG. 1, the second range R2 is the entire range in the inner surface of the concave portion 32 except for the first range R1. The second conductive film 43 contains the same metal as the metal contained in the first conductive film 42 (for example, tungsten). Further, the second conductive film 43 contains the same inhibitor as the inhibitor contained in the first conductive film 42 (for example, nitrogen).

The conductive layer 44 is provided on the first conductive film 42 and the second conductive film 43. The conductive layer 44 contains the same metal as the metal contained in the first conductive film 42 (for example, tungsten).

The first conductive film 42 is higher in concentration of the inhibitor than the second conductive film 43. Generation of a cavity in the conductive layer 44 can be inhibited because of the higher concentration of the inhibitor in the first conductive film 42.

Next, a method for manufacturing the semiconductor device 1 configured as described above is explained with reference to FIGS. 2 to 7.

Figure 2:
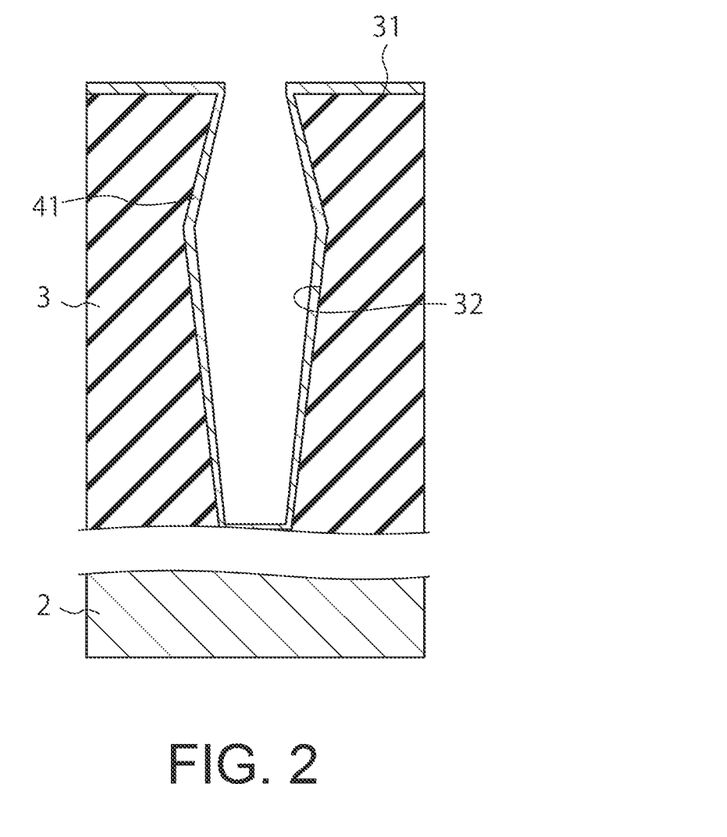
FIG. 2 is a cross-sectional view illustrating a semiconductor manufacturing method according to the embodiment.

FIG. 2 is a cross-sectional view illustrating a semiconductor manufacturing method according to the embodiment. First, as illustrated in FIG. 2, the concave portion 32 is formed in the interlayer dielectric film 3 provided on the semiconductor substrate 2 from the top surface 31 of the interlayer dielectric film 3 downwards. The concave portion 32 is formed by photolithography or RIE, for example. After the concave portion 32 is formed, the barrier metal film 41 is formed on the inner surface of the concave portion 32, as illustrated in FIG. 2. Formation of the barrier metal film 41 is performed by, for example, depositing a titanium nitride film by CVD (Chemical Vapor Deposition). By formation of the barrier metal film 41, it is possible to ensure adhesion of the wiring layer 4 to the concave portion 32 and to inhibit diffusion of metal contained in the wiring layer 4 into the interlayer dielectric film 3.

Figure 3:
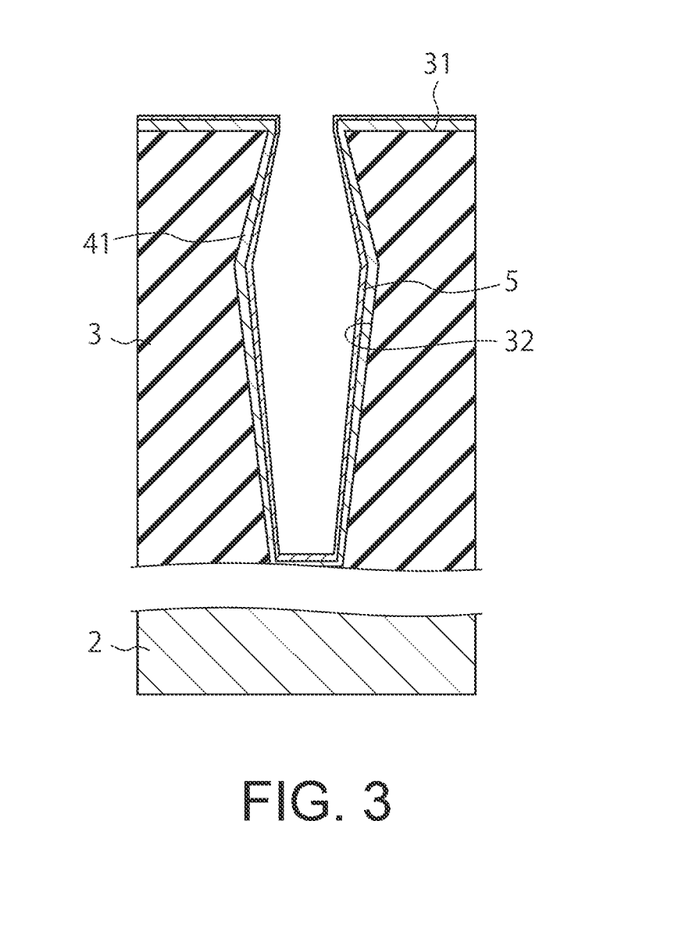
FIG. 3 is a cross-sectional view illustrating the semiconductor manufacturing method according to the embodiment in continuation from FIG. 2.

FIG. 3 is a cross-sectional view illustrating the semiconductor manufacturing method according to the embodiment in continuation from FIG. 2. After the barrier metal film 41 is formed, a silicon film 5 is formed on the inner surface of the concave portion 32 via the barrier metal film 41, as illustrated in FIG. 3. The silicon film 5 is formed by CVD, for example. From a viewpoint of appropriately replacing the silicon film 5 with the conductive films 42 and 43, the thickness of the silicon film 5 is preferably from 0.5 to 10 nm.

Figure 4:
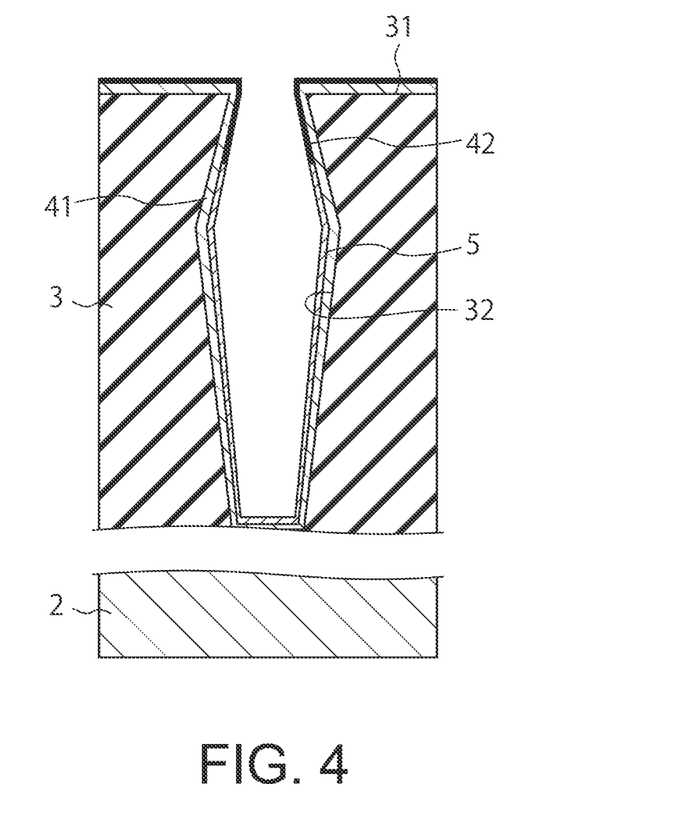
FIG. 4 is a cross-sectional view illustrating the semiconductor manufacturing method according to the embodiment in continuation from FIG. 3.

FIG. 4 is a cross-sectional view illustrating the semiconductor manufacturing method according to the embodiment in continuation from FIG. 3. After being formed, the silicon film 5 is exposed to a raw material gas of metal (for example, tungsten) contained in the first conductive film 42 and an inhibitor gas that inhibits growth of the metal at a first temperature, as illustrated in FIG. 4. The first temperature is 400° C. or higher, and may be 500° C., for example. By setting the first temperature to 400° C. or higher, it is possible to make the concentration of nitrogen that is an example of an inhibitor in the first conductive film 42 as high as 6 [atomic %] or more. The raw material gas is tungsten hexafluoride ($WF_6$) gas, for example. The inhibitor gas is a gas of the aforementioned inhibitor and is nitrogen gas, for example. By exposing the silicon film 5 to the raw material gas and the inhibitor gas at the first temperature, a first portion of the silicon film 5 located in an upper-end side portion of the concave portion 32, that is, on the first range R1 is replaced with the first conductive film 42, as illustrated in FIG. 4. At this time, the time for exposing the silicon film 5 to the raw material gas and the inhibitor gas is set to be relatively short in such a manner that only the first portion is replaced with the first conductive film 42. The exposure time at the first temperature may be several seconds, for example. Partial replacement of the silicon film 5 with the first conductive film 42 is performed by CVD, for example.

Figure 5:
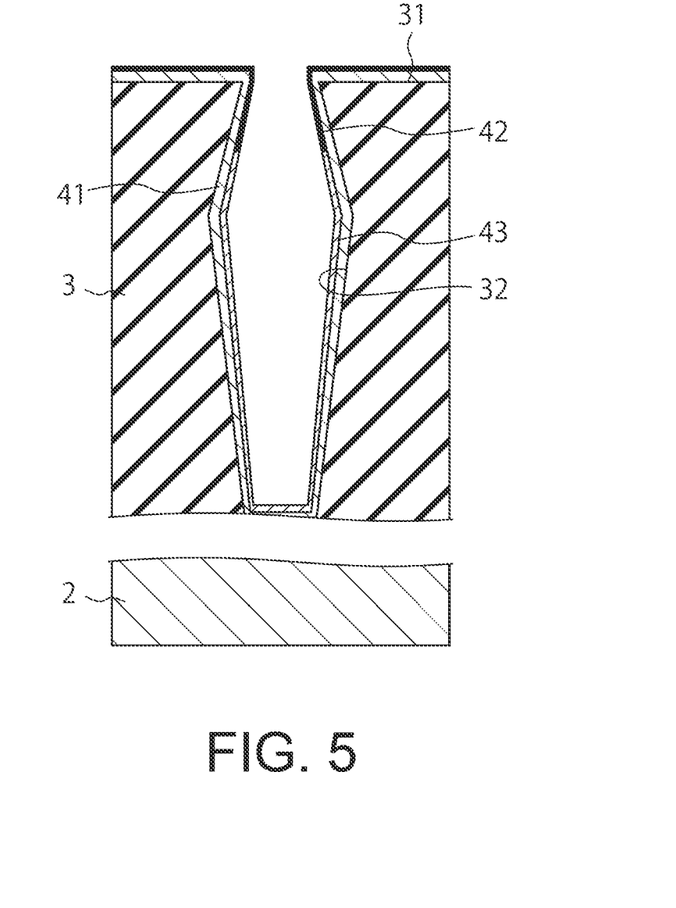
FIG. 5 is a cross-sectional view illustrating the semiconductor manufacturing method according to the embodiment in continuation from FIG. 4.

FIG. 5 is a cross-sectional view illustrating the semiconductor manufacturing method according to the embodiment in continuation from FIG. 4. By partially replacing the silicon film 5 with the first conductive film 42, the silicon film 5 is exposed to the raw material gas and the inhibitor gas that have been described above at a second temperature lower than the first temperature, as illustrated in FIG. 5. The second temperature is lower than 400° C., and may be 300° C., for example. By setting the second temperature lower than 400° C., it is possible to make the concentration of nitrogen in the second conductive film 43 as low as less than 6 [atomic %]. By exposing the silicon film 5 to the raw material gas and the inhibitor gas at the second temperature, a second portion of the silicon film 5 located on the second range R2 of the concave portion 32 is replaced with the second conductive film 43, as illustrated in FIG. 5. In order to perform appropriate replacement of the second portion with the second conductive film 43, the time for exposing the silicon film 5 to the raw material gas and the inhibitor gas is set to be longer than the exposure time at the first temperature. The exposure time at the second temperature may be several tens of seconds, for example. Partial replacement of the silicon film 5 with the second conductive film 43 is performed by CVD, for example.

Consequently, the first conductive film 42 having a higher concentration of the inhibitor and the second conductive film 43 having a lower concentration of the inhibitor are formed.

Figure 6:
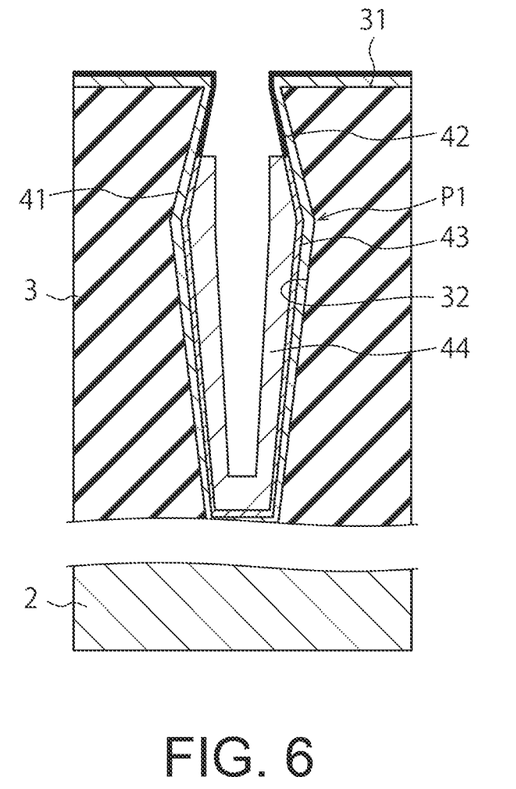
FIG. 6 is a cross-sectional view illustrating the semiconductor manufacturing method according to the embodiment in continuation from FIG. 5.

FIG. 6 is a cross-sectional view illustrating the semiconductor manufacturing method according to the embodiment in continuation from FIG. 5. After the silicon film 5 is replaced with the first conductive film 42 and the second conductive film 43, the conductive layer 44 is formed using the raw material gas to fill the concave portion 32, as illustrated in FIG. 6. The conductive layer 44 is formed by CVD, for example.

In a case where the conductive layer 44 is formed on the first conductive film 42 and the second conductive film 43 at a constant growth rate, an opening-side portion of the concave portion 32 above the first position P1 is filled with the conductive layer 44, before the concave portion 32 is filled with the conductive layer 44 at the first position P1 at which the width w is the maximum. That is, an opening of the concave portion 32 for introducing the raw material gas into the concave portion 32 is blocked with the conductive layer 44. The blockage of the opening of the concave portion 32 inhibits subsequent growth of the conductive layer 44, resulting in generation of a cavity in the conductive layer 44 on a side close to the first position P1.

On the other hand, according to the embodiment, the first conductive film 42 has a higher concentration of the inhibitor that inhibits growth of metal (for example, tungsten) constituting the conductive layer 44. Accordingly, the conductive layer 44 is formed preferentially on the second conductive film 43, as illustrated in FIG. 6. That is, formation of the conductive layer 44 is inhibited on the first conductive film 42 located on a side close to the upper-end opening in the concave portion 32. Since formation of the conductive layer 44 on the first conductive film 42 is inhibited, it is possible to inhibit blockage of the opening of the concave portion 32 with the conductive layer 44 before the concave portion 32 is filled with the conductive layer 44.

The conductive layer 44 may be formed by continuing the process of exposing the silicon film 5 to the raw material gas and the inhibitor gas at the second temperature. In this case, man-hours can be reduced.

Figure 7:
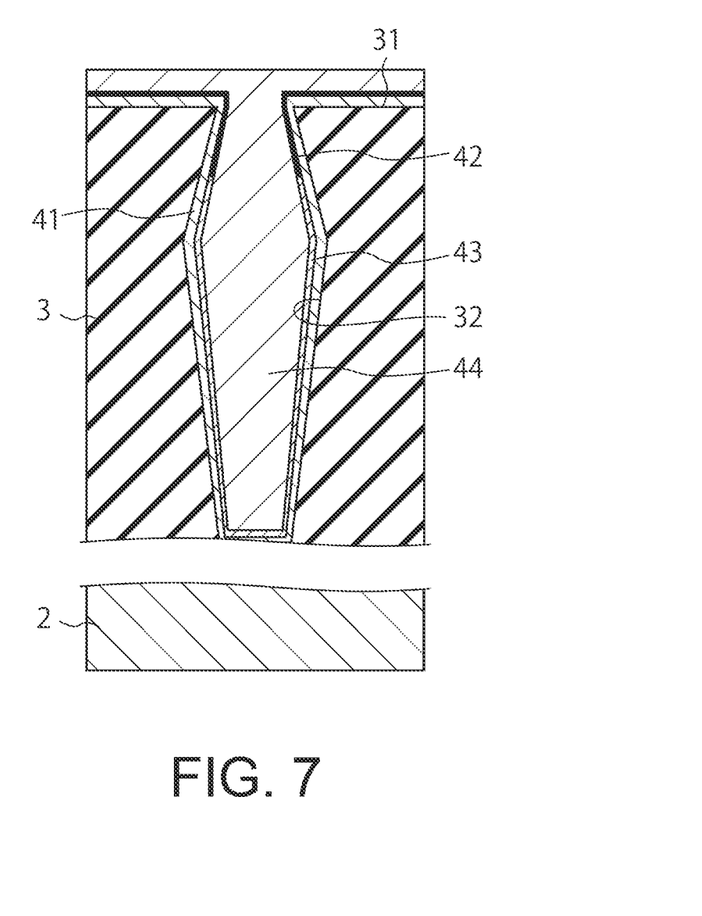
FIG. 7 is a cross-sectional view illustrating the semiconductor manufacturing method according to the embodiment in continuation from FIG. 6.

FIG. 7 is a cross-sectional view illustrating the semiconductor manufacturing method according to the embodiment in continuation from FIG. 6. By further advancing the formation of the conductive layer 44 from the state illustrated in FIG. 6, the conductive layer 44 is formed on the first conductive film 42 and the second conductive film 43, as illustrated in FIG. 7. Since formation of the conductive layer 44 on the first conductive film 42 is inhibited and blockage of the upper-end opening of the concave portion 32 with the conductive layer 44 is inhibited, generation of a cavity in the conductive layer 44 is inhibited, as illustrated in FIG. 7.

As described above, according to the present embodiment, the silicon film 5 is exposed to a raw material gas and an inhibitor gas at the first temperature to cause replacement of the first portion of the silicon film 5 located in an upper-end side portion of the concave portion 32 with the first conductive film 42, and the silicon film 5 is exposed to the raw material gas and the inhibitor gas at the second temperature lower than the first temperature to cause replacement of the second portion of the silicon film 5 different from the first portion with the second conductive film 43, whereby it is possible to inhibit generation of a cavity in the conductive layer 44. Accordingly, the wiring layer 4 can be appropriately formed in the concave portion 32. By forming the wiring layer 4 in which generation of a cavity is inhibited, it is possible to appropriately ensure electric characteristics (a resistance value) and a mechanical strength of the wiring layer 4.

A plurality of modifications described below can be applied to the embodiment described above.

Figure 8:
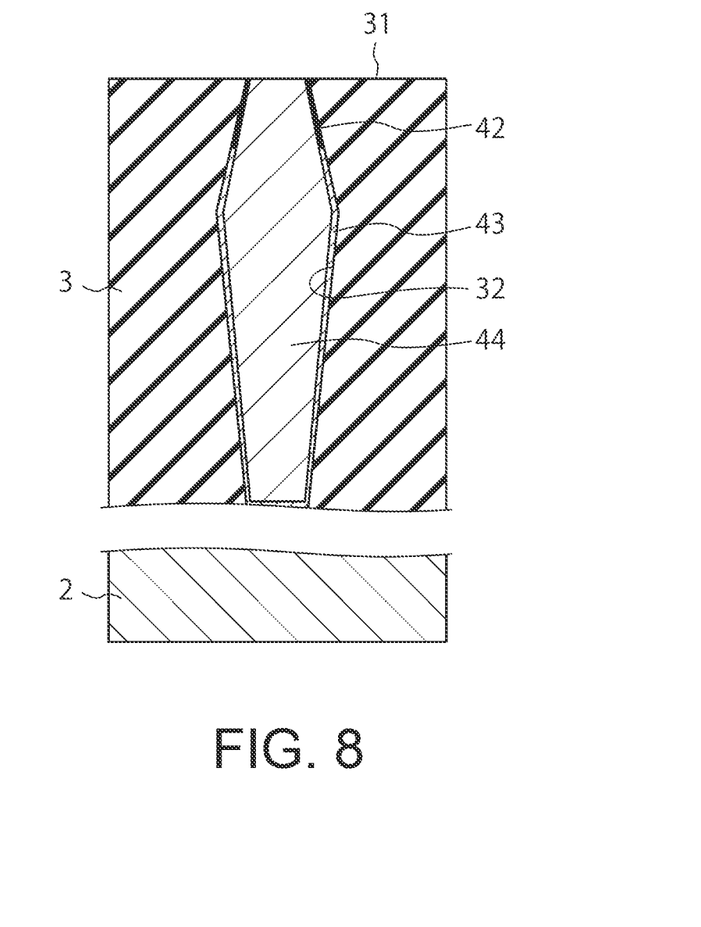
FIG. 8 is a cross-sectional view illustrating a semiconductor device according to a first modification.

FIG. 8 is a cross-sectional view illustrating the semiconductor device 1 according to a first modification. In FIG. 1, the semiconductor device 1 has been illustrated which includes the barrier metal film 41 between the inner surface of the concave portion 32 and the first and second conductive films 42 and 43. However, the barrier metal film 41 may be omitted, as illustrated in FIG. 8. According to the first modification, the man-hours and the cost of manufacturing can be reduced.

Figure 9:
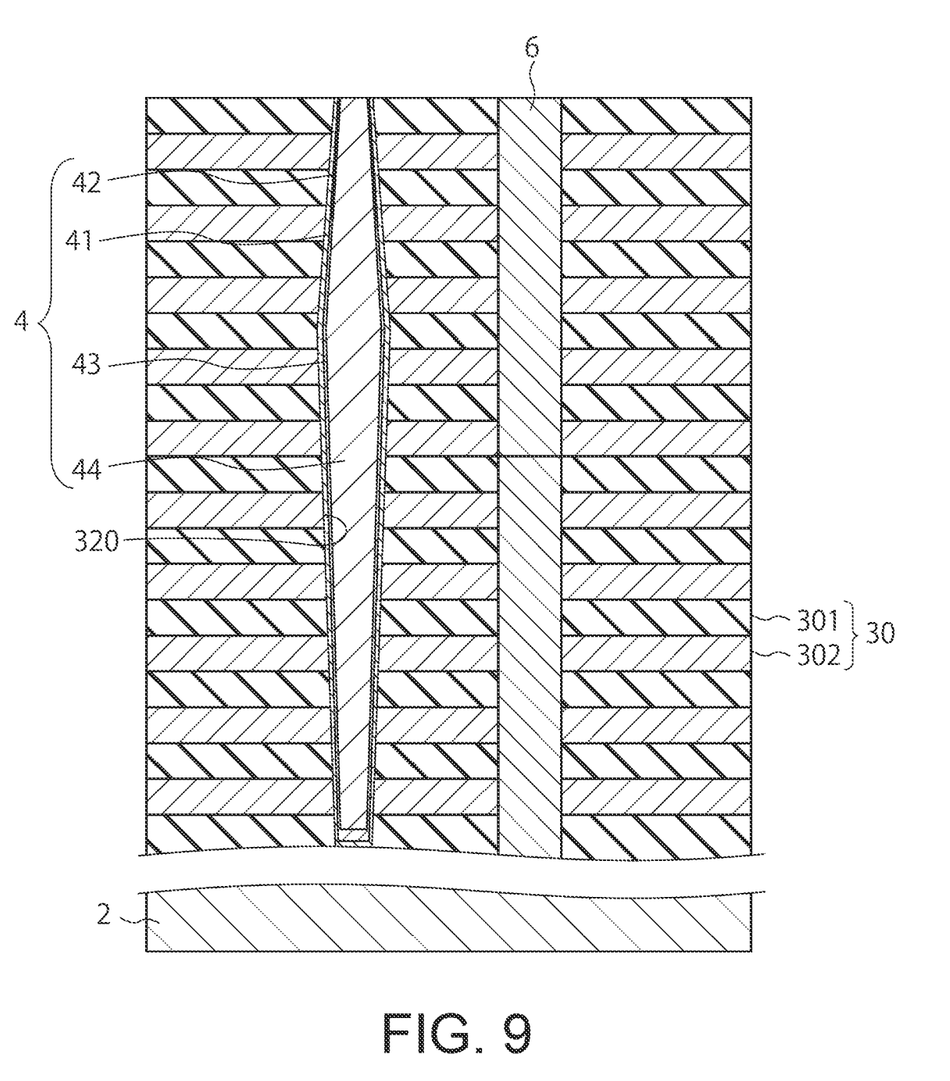
FIG. 9 is a cross-sectional view illustrating a semiconductor device according to a second modification.

FIG. 9 is a cross-sectional view illustrating the semiconductor device 1 according to a second modification. In FIG. 1, the semiconductor device 1 has been described in which the wiring layer 4 is provided in the concave portion 32 provided in the interlayer dielectric film 3. However, the wiring layer 4 may be provided in a slit 320 provided in a stack 30 of an insulation layer 301 and a conductive layer 302 from the top surface of the stack 30 downwards, as illustrated in FIG. 9. The semiconductor device 1 illustrated in FIG. 9 is a three-dimensional semiconductor memory. The insulation layer 301 is a silicon oxide film, for example. The conductive layer 302 contains tungsten, for example.

The semiconductor device 1 according to the second modification includes a columnar memory cell 6 that penetrates through the stack 30. The memory cell 6 includes a memory film (not illustrated) and a silicon column (not illustrated) inside the memory film. The memory film includes, for example, a block insulation film, a charge storage layer, and a tunnel insulation film from outside in that order. The wiring layer 4 is used for connecting a source line (not illustrated) connected to a lower end of the wiring layer 4 to an upper-layer wire (not illustrated). The slit 320 is used for replacing a sacrifice layer 303 between the insulation layers 301, which will be described later, with the conductive layer 302.

Figure 10:
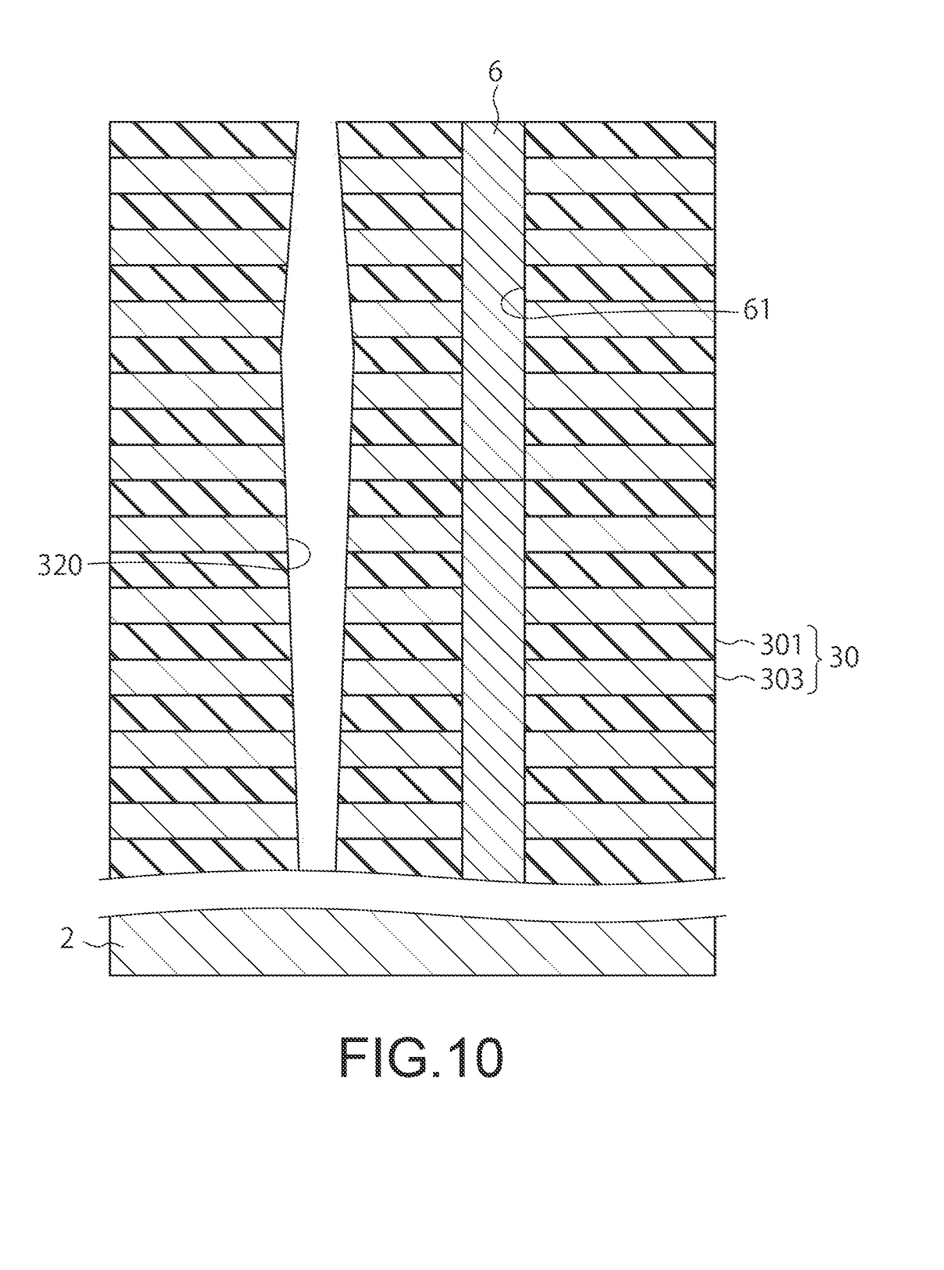
FIG. 10 is a cross-sectional view illustrating a semiconductor manufacturing method according to the second modification.
Figure 11:
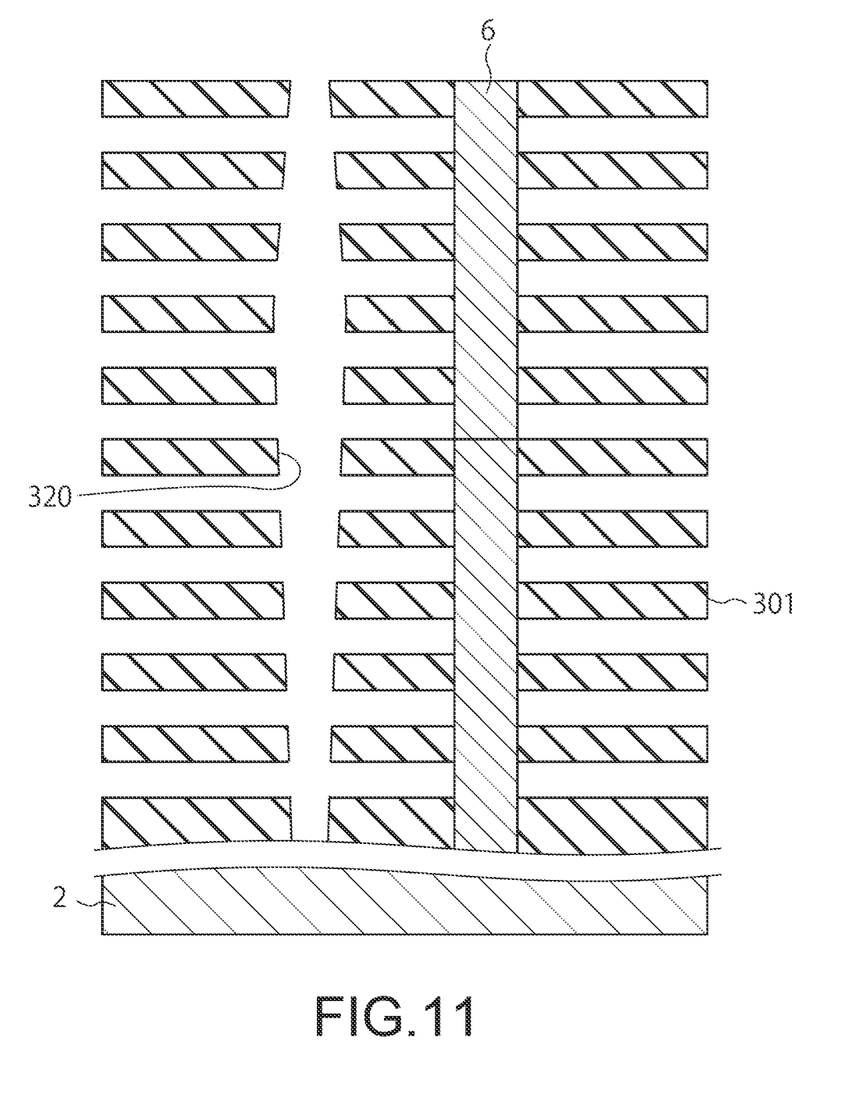
FIG. 11 is a cross-sectional view illustrating the semiconductor manufacturing method according to the second modification in continuation from FIG. 10.

FIG. 10 is a cross-sectional view illustrating a semiconductor manufacturing method according to the second modification. In order to manufacture the semiconductor device 1 according to the second modification, a stack 300 of the insulation layer 301 and the sacrifice layer 303 is formed by, for example, CVD on the semiconductor substrate 2, as illustrated in FIG. 10. The sacrifice layer 303 is a silicon nitride film, for example. A memory hole 61 penetrating through the stack 300 is then formed by, for example, RIE and thereafter the memory cell 6 is formed in the memory hole 61. The memory cell 6 may be formed in two steps, that is, by forming a lower layer portion and forming an upper layer portion. Further, the slit 320 penetrating through the stack 300 is provided by RIE, for example. FIG. 11 is a cross-sectional view illustrating the semiconductor manufacturing method according to the second modification in continuation from FIG. 10. After the slit 320 is formed, the sacrifice layers 303 are selectively removed from the stack 300 by wet etching through the slit 320, as illustrated in FIG. 11.

After the sacrifice layers 303 are removed, the conductive layers 302 are formed by, for example, CVD in cavities formed by removal of the sacrifice layers 303. Further, the wiring layer 4 is formed in the slit 320 in an identical manner to that illustrated in FIGS. 1 to 8.

According to the second modification, the wiring layer 4 can be appropriately formed in the slit 320 in a manufacturing process of a three-dimensional semiconductor memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a layer provided above a substrate, provided with a concave portion from its top surface downwards, and including an insulation layer at least partially;
   a first conductive film provided on a first range that is an upper-end side portion of an inner surface of the concave portion, and containing metal and an inhibitor that inhibits growth of the metal;
   a second conductive film provided on a second range of the inner surface of the concave portion and containing the metal and the inhibitor, the second range being different from the first range; and
   a conductive layer provided on the first conductive film and the second conductive film and containing the metal, wherein
   the first conductive film is higher in concentration of the inhibitor than the second conductive film.

2. The device of claim 1, wherein
   the metal is tungsten and
   the inhibitor is nitrogen.

3. The device of claim 1, wherein the layer including the insulation layer is a stack of the insulation layer and a conductive layer.

* * * * *